United States Patent [19]
Graziano et al.

[11] Patent Number: 5,376,504
[45] Date of Patent: Dec. 27, 1994

[54] ACID-HARDENING PHOTORESISTS COMPRISING A PURIFIED HEXAMETHOXY METHYLMELAMINE RESIN AS A CROSSLINKER

[75] Inventors: Karen A. Graziano, Warrington; Leonard E. Bogan, Jr., Harleysville; Robert J. Olsen; Susan E. Anderson, both of Lansdale, all of Pa.

[73] Assignee: Rohm and Haas Company, Philadelphia, Pa.

[21] Appl. No.: 936,869

[22] Filed: Aug. 27, 1992

Related U.S. Application Data

[63] Continuation of Ser. No. 781,631, Oct. 22, 1991, abandoned, which is a continuation of Ser. No. 376,713, Jul. 7, 1989, abandoned.

[51] Int. Cl.$^5$ .......................... G03F 7/004; G03F 7/40
[52] U.S. Cl. .................... 430/270; 430/168; 430/169; 430/191; 430/192; 430/325; 430/330; 430/905
[58] Field of Search ............. 430/270, 192, 193, 176, 430/330, 325, 905

[56] References Cited

U.S. PATENT DOCUMENTS

| | | | |
|---|---|---|---|
| 3,322,762 | 5/1967 | Erikson et al. | 528/254 |
| 3,744,904 | 7/1973 | Loprest et al. | 430/169 |
| 4,129,681 | 12/1978 | Anderson et al. | 528/258 |
| 4,149,888 | 4/1979 | Loprest | 430/157 |
| 4,181,526 | 1/1980 | Blakey et al. | 430/67 |
| 4,341,859 | 7/1982 | Keane et al. | 430/270 |
| 4,478,932 | 10/1984 | Keane et al. | 430/277 |
| 4,518,676 | 5/1988 | Irving | 430/280 |
| 4,734,444 | 3/1988 | Henne et al. | 430/280 |
| 4,801,508 | 1/1989 | Lutz et al. | 430/162 |
| 4,875,124 | 10/1989 | Dickstein et al. | 360/126 |
| 5,034,304 | 7/1991 | Feely | 430/270 |

FOREIGN PATENT DOCUMENTS

| | | | |
|---|---|---|---|
| 21914 | 6/1984 | Australia . | |
| 2191483 | 12/1987 | Australia | 430/192 |
| 0164248 | 11/1985 | European Pat. Off. | 430/192 |
| 164248 | 12/1985 | European Pat. Off. . | |

*Primary Examiner*—Charles L. Bowers, Jr.
*Assistant Examiner*—John S. Chu
*Attorney, Agent, or Firm*—Brian W. Stegman

[57] ABSTRACT

Photoresists are disclosed that display increased sensitivity, measured as lithographic potential, when compared to known photoresists that contain melamine resin as a crosslinker. The melamine resin in these photoresists contains a higher percent by weight of monomeric hexamethoxymethylmelamine than in known resists.

6 Claims, No Drawings

ACID-HARDENING PHOTORESISTS COMPRISING A PURIFIED HEXAMETHOXY METHYLMELAMINE RESIN AS A CROSSLINKER

This application is a continuation of application Ser. No. 781,631, filed Nov. 22, 1991, now abandoned, which is a continuation, of application Ser. No. 376,713, filed Jul. 7, 1989, now abandoned.

BACKGROUND OF THE INVENTION

Acid-hardening photoresist compositions that contain melamine resin as a crosslinker have been disclosed, for example in published European Patent Applications 85303807.3, 87300220.8, and 87300219.0. These patent applications disclose photoresists that contain acid-hardening resin that contain an aminoplast such as melamine resin as a crosslinker, along with resins such as novolac or polyvinylphenol, and a photoacid generator. The photoacid generator produces acid in response to exposure to the activating wavelength. The acid initiates the reaction between the components of the acid-hardening resin. The melamine resins that are disclosed to be useful in these applications include Cymel 303, a commercially available melamine resin that contains hexamethoxymethylmelamine resin monomer as well as dimers and trimers of the monomer.

Hexamethoxymethylmelamine, (HMMM), has been used in coating compositions and is commercially supplied, for example by American Cyanamid Company which markets products of various purity under the the tradename Cymel, such as Cymel 303, Cymel 300, etc.. The art contains disclosures of experiments that are said to be run using hexamethoxymethylmelamine when the reagent was a commercial resin such as Cymel. Commercially supplied melamine resin materials such as the Cymel resins contain significant quantities of impurities, such as dimers, trimers, tetramers, and contaminants. Gel Permeation Chromatography of samples of Cymel 300, a high purity version of hexamethoxy-methylmelamine, revealed: a monomer content of 74 to 79 percent by weight; a dimer content of from 16 to 19 percent; and a trimer content of from 4 to 7 percent by weight.

Lithographic potential is a measure of the expected lithographic performance of a photoresist composition. Lithographic potential is expressed as a numeric value, equal to the $\log_{10}$ of the result of dividing the dissolution rate of the unexposed areas of the resist by the dissolution rate of the exposed areas of the resist. The lithographic potential is an expression of the observed degree of reaction in the exposed areas in response to the dose at a particular wavelength of the exposing radiation. A lowered dissolution rate indicates increased resistance of the resin to removal by the developer solution, and therefore serves as a measure of the degree of chemical reaction in response to the exposing radiation. The sensitivity of various resists can be compared by measuring their lithographic potentials. A resist that requires a lower dose at the exposing wavelength to produce a lithographic potential of a given value can be said to be more sensitive than a resist that requires a higher dose to produce a lithographic potential of the same value.

Objects of the Invention

It is therefore an object of the invention to provide acid-hardening photoresists that display improved sensitivity.

Another object of the invention is to provide an acid-hardening photoresist of improved shelf-life.

SUMMARY OF THE INVENTION

The present invention provides photoresists of improved sensitivity wherein the melamine resin contains an increased amount of hexamethoxymethylmelamine monomer by weight. The monomer content is greater than 83%, usually greater than 87%, and preferably greater than 89% by weight.

The invention also provides a photoresist of improved shelf-life wherein the melamine resin has been purified to remove synthesis by-products and contaminants. Preferably the melamine resin is distilled hexamethoxymethylmelamine resin monomer.

DETAILED DESCRIPTION OF THE INVENTION

The resists according to the present invention display improved sensitivity over previously known resists that contain melamine resin as the crosslinker. Applicants have found a pronounced increase in the sensitivity of photoresists when the melamine resin component of the resist contains a high percentage of monomeric hexamethoxymethylmelamine.

Hexamethoxymethylmelamine

The structural formula for monomeric hexamethoxymethylmelamine is:

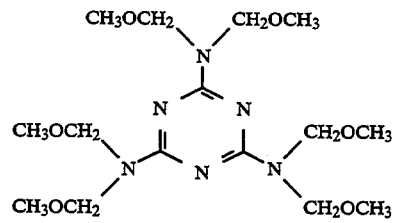

Significant proportions of dimers and trimers of hexamethoxymethylmelamine are produced as synthesis by-products or through an acid-catalyzed condensation reaction and are present in commercial products.

Applicants have found that photoresists that contain melamine resin crosslinker of high monomeric hexamethoxymethylmelaminecontent have improved sensitivity. as measured by lithographic potential, when compared to known melamine resin containing photoresists. The photoresists according to the invention contain melamine resin having greater than 87 percent monomeric hexamethoxymethylmelamine resin by weight. The preferred amount of monomeric hexamethoxymethylmelamine is from about 89 to about 100 percent based on the total weight of the melamine resin.

The resist also contains a resin that reacts with the melamine resin in an acid-catalyzed reaction and a photoacid generator, a compound that generates or releases acid in response to the wavelength of the exposing radiation. Suitable resins and photoacid generators include those described in U.S. Ser. Nos. 369,438 abandoned and U.S. Pat. No. 5,034,304, commonly owned, the disclosures of which are hereby incorporated by reference.

The use of high hexamethoxymethylmelamine monomer content resin to improve the sensitivity of other melamine resin-containing photoresists is also contemplated as within this invention. The use of additional resins along with the hexamethoxymethylmelamine as the components of an acid-hardening resin system or different photosensitizers to initiate the hardening reaction between the melamine resin and the other resin should not be construed to bring a photoresist outside the scope of this invention.

The preparation of hexamethoxmethylmelamine is well known and is described for example in U.S. Pat. Nos. 3,322,762, and 3,488,350. melamine resin resins that contain hexamethoxymethylmelamine are commercially available, for example from American Cyanamid Company under the tradename Cymel. High purity monomer can be recovered from the commercially available materials for example by batch distillation. Purification by distillation removes by-products of synthesis such as oligomers and incompletely substituted compounds, such as those containing free methylol groups.

Distillation also removes contaminants such as metal catalyst residues and water. Resists that contain purified hexamethoxymethylmelamine have been observed to have improved shelf-life versus resists that contain commercially available melamine resin. The improved shelf-life of resists that contain purified hexamethoxymethylmelamine is believed to be a result of removal of impurities that cause the hexamethoxymethylmelamine to self-condense. A component study indicates that the shelf-life problem can be experimentally caused to occur in a sample of purified hexamethoxymethylmelamine resin by reintroducing water into the purified sample and then storing in the presence of novolac.

The following examples are provided to further illustrate aspects of the invention, they should not be construed as limiting the scope of the invention here disclosed, which is more fully described in the specification and claims.

EXAMPLES

Unless otherwise stated: the resist solutions were spin-coated onto wafers at 3000 revolutions per minute; the coated wafers were prebaked on a hotplate at 80° C. for one minute; post baked on a hotplate at 115° C. for one minute and developed using 0.27N Shipley MF-322 tetramethylammonium hydroxide.

EXAMPLE 1

Preparation of Purified Hexamethoxymethylmelamine

Cymel 300 melamine resin (American Cyanamid Company) was purified through a simple vacuum distillation using a 6" Vigreux column, maintaining the head temperature at 249°–253° C. and using a steam condenser to collect the efflux. The product was analyzed by Gel Permeation Chromatography and contained 99% hexamethoxymethylmelamine.

EXAMPLE 2

Comparison of Purified Hexamethoxymethylmelamine Resist to a known Acid-Hardening Resist Two resist solutions were prepared according to the following formulation: 60 grams of cresol novolac; 273 grams of Microposit Thinner Type A, cellosolve acetate, (Shipley Company); 1.73 grams of tris(2,3-dibromopropyl)isocyanurate; and 9 grams of melamine resin. In the first resist, Comparison A, the melamine resin was Cymel 303. In the second resist, Example 2, the melamine resin was a distilled sample of hexamethoxymethylmelamine containing greater than 99% monomer by weight. On day 0, samples of these resists were coated on wafers, exposed at 254 nanometers and developed using a Development Rate Monitor. Other samples of the two resists were heat aged at 50° C. for periods of 4, 7 and 14 days and at the end of the interval, the samples were coated onto wafers, exposed and developed using a Development Rate Monitor.

The Example 2 resist showed surprisingly increased sensitivity over that of the Comparison A resist on day 0 and the Example 2 resist showed little decrease in sensitivity after 4, 7 and 14 days of heat aging. The Comparison A resist showed poorer sensitivity on day 0 and its sensitivity degraded further during the storage test.

EXAMPLE 3

Resists were prepared using the same proportions of novolac, photoacid generator and melamine resin, changing only the composition of the melamine resin. A standard solution was prepared by mixing: 103.18 grams of a solution of cresol novolac (30% solids) in cellosolve acetate sovent; 68.78 grams of added cellosolve acetate solvent; and 0.923 grams of tris(2,3- dibromopropyl-)isocyanurate photoacid generator. Test samples were prepared by taking 25 gram aliquots from the standard solution and adding 0.655 grams of melamine resin to the aliquot. The melamine resin used in the various samples was prepared using a sample of Cymel 300 resin that contained 75% monomer by weight, a sample of Distilled hexamethoxymethylmelamine that contained greater than 99% monomer by weight, and blends of these two materials. In a preliminary test the monomer content in the melamine resins was varied in five resist samples prepared using Cymel 300, distilled hexamethoxymethylmelamine and blends of these two resins at proportions of 25/75, 50/50, and 75/25 to produce resists that contained melamine resin having approximately 75, 81.25, 87.5, 93.75 and 100 percent hexamethoxymethylmelamine monomer by weight.

These resists were coated on wafers, exposed and developed using a Development Rate Monitor to measure lithographic potential. The results indicated significant improvement in sensitivity for the resists prepared using melamine resin having hexamethoxymethylmelamine content of 87.5 weight percent and greater. A second set of resists that contained melamine resin having hexamethoxymethylmelamine content of 83, 85, 87, 89 and 92 weight percent were prepared and processed as above and the results of both sets of experiments are presented in Table 1 below:

TABLE 1

| Sample No. | Monomer Content of the melamine resin (% by weight) | Lithographic Potential at dose of 0.234 mJ/cm$^2$ |
| --- | --- | --- |
| 1 | 75.0 | 0.20 |
| 2 | 81.25 | 0.20 |
| 3 | 83.0 | 0.25 |
| 4 | 85.0 | 0.26 |
| 5 | 87.0 | 0.26 |
| 6 | 87.5 | 0.28 |
| 7 | 89.0 | 0.29 |
| 8 | 92 | 0.36 |
| 9 | 93.75 | 0.43 |
| 10 | 100 | 0.80 |

The data shows that the performance of the otherwise identical resist materials surprisingly improved when the hexamethoxymethylmelamine monomer content of the melamine resin was increased to about 83% and the sensitivity increased more rapidly as the hexamethoxymethylmelamine monomer content of the melamine resin was raised from greater than about 87%, preferably greater than about 89% by weight, to about 100% hexamethoxymethylmelamine monomer content by weight.

EXAMPLE 4

Two solutions were prepared according to the following formulation: 51.59 grams of a solution of cresol novolac (30% solids) in cellosolve acetate; 34.39 grams of added cellosolve acetate; and 2.33 grams of melamine resin. In the first solution, Comparative B, the melamine resin was Cymel 303 (American Cyanamid). In the second solution, Example 4, the melamine resin was purified hexamethoxymethylmelamine (~100% monomer). Experimental samples were prepared by taking 15 gram aliquots from one of these two solutions and adding 0.039 grams of 1,1-bis(p-chlorophenyl), 1-chloro,2,2,2-trichloroethane as photoacid generator. The resists were coated onto wafers, exposed to a dose of 1 mJ/cm$^2$ at 254 nanometers and developed using a development rate monitor. The data demonstrated greater than about a two-fold increase in lithographic potential for the Example 4 resist containing purified hexamethoxymethylmelamine compared against the known Cymel-containing Comparative B resist.

EXAMPLE 5

Distilled Hexamethoxymethylmelamine in Polyvinylphenol Resist

A resist was prepared by mixing: 203.5 grams of a 30% solution of polyvinylphenol in bis-(2-methoxyethyl) ether ("diglyme"); 6 grams of distilled hexamethoxymethylmelamine (~99% monomer); 1.75 grams of tris(2,3dibromopropyl)isocyanurate; and 135.6 grams of diglyme. The resist was spin-coated onto wafers at 4000 rpm, prebaked at 80° C. for one minute, then exposed at 254 nanometers using an HTG exposure tool. The exposed resist was post-baked for one minute at 115° C. and developed with 0.12 N tetramethylammonium hydroxide using a Development Rate Monitor to generate a lithographic potential curve which demonstrated excellent sensitivity of the resist.

EXAMPLE 6

Distilled Hexamethoxymethylmelamine in E-beam Resist

A resist was prepared by mixing 16.5 grams of meta-cresol novolac resin, 1.9 grams of tris(2,3-dibromopropyl)isocyanurate, 2.47 grams of distilled hexamethoxymethylmelamine (99% monomer) and 75 grams of Microposit Thinner Type A, cellosolve acetate, (Shipley Company). The resist was spin-coated onto wafers at 4000 rpm, prebaked at 80° C. for one minute, then exposed to 20 keV using a Cambridge electron beam exposure tool. The exposed resist was post-baked for one minute at 115° C. and developed at a rate of 300Å/second for 4 minutes using tetramethylammonium hydroxide developer. This experiment demonstrates the use of purified hexamethoxymethylmelamine in an E-beam resist.

EXAMPLE 7

Distilled Hexamethoxymethylmelamine in X-ray Resist

A resist was prepared by mixing 66 grams of meta-cresol novolac resin, 15.2 grams of tris(dibromopropyl)isocyanurate, 9.9 grams of distilled hexamethoxymethylmelamine (99% monomer), and 75 grams of Thinner A (Shipley Company). The resist was spin-coated onto wafers at 3500 rpm, prebaked at 80° C. for one minute, the exposed using a palladium point source X-ray exposure tool. The exposed resist was post-baked for one minute at 115° C. and developed at a rate of 500Å/ second for 8 minutes using tetramethylammonium hydroxide developer. This experiment demonstrates the use of purified hexamethoxymethylmelamine in an X-ray resist.

We claim:

1. A melamine resin-containing photoresist of improved shelf-life comprising in admixture a photoacid generator, a melamine resin containing greater than 83% hexamethoxymethylmelamine monomer by weight, a resin that reacts with the melamine in an acid catalyzed reaction and in which the melamine resin is the product of a purification which removes the synthesis by-products and impurities in the melamine resin that promote self-condensation of the hexamethoxymethylmelamine monomer to an extent sufficient to reduce the degree of oligomerization during storage of the liquid resist.

2. The photoresist of claim 1 wherein the melamine resin is distilled hexamethoxymethylmelamine.

3. A process of producing a high sensitivity photoresist composition on a substrate comprising mixing a melamine resin containing greater than 83% hexamethoxymethylmelamine monomer by weight with a photoacid generator and a resin that reacts with the melamine in an acid catalyzed reaction, and coating a substrate with the resulting mixture, wherein the melamine resin is the product of a purification which removes the synthesis by-products and impurities in the melamine resin that promote self-condensation of the hexamethoxymethylmelamine monomer to an extent sufficient to reduce the degree of oligomerization during storage of the liquid resist.

4. The method of claim 3 wherein the hexamethoxymethylmelamine monomer content is greater than 87 percent.

5. The method of claim 3 wherein the hexamethoxymethylmelamine monomer content is greater than 89 percent.

6. A process according to claim 3 wherein the melamine resin is the product of distillation.

* * * * *